United States Patent [19]
Okada et al.

[11] 3,987,365
[45] Oct. 19, 1976

[54] DIGITAL FREQUENCY COMPARATOR CIRCUIT

[75] Inventors: Tsuguhiro Okada, Hitachi; Akira Endo, Katsuta, both of Japan

[73] Assignee: Hitachi, Ltd., Japan

[22] Filed: Feb. 24, 1975

[21] Appl. No.: 552,238

[30] Foreign Application Priority Data

Mar. 1, 1974 Japan.............................. 49-23351

[52] U.S. Cl................................. 328/133; 328/48; 307/233 A
[51] Int. Cl.².......................................... H03D 13/00
[58] Field of Search.................... 328/133, 134, 48; 307/233 A; 233 R

[56] References Cited
UNITED STATES PATENTS

| | | | |
|---|---|---|---|
| 3,441,342 | 4/1969 | Ball et al........................ | 328/134 X |
| 3,588,710 | 6/1971 | Masters........................... | 328/133 |
| 3,723,889 | 3/1973 | Oberst............................. | 328/134 |
| 3,735,324 | 5/1973 | Phillips............................ | 328/133 |
| 3,755,746 | 8/1973 | Hogue............................. | 328/133 |

*Primary Examiner*—John S. Heyman
*Attorney, Agent, or Firm*—Craig & Antonelli

[57] ABSTRACT

A digital frequency comparator circuit comprising two counters connected to a circuit to be driven, in which one of the two counters which earlier issues an output signal is temporarily held, and both the counters are not cleared until the other counter subsequently issues an output signal, whereby an instability in the operation of the circuit to be driven is eliminated.

11 Claims, 5 Drawing Figures

F I G. 4
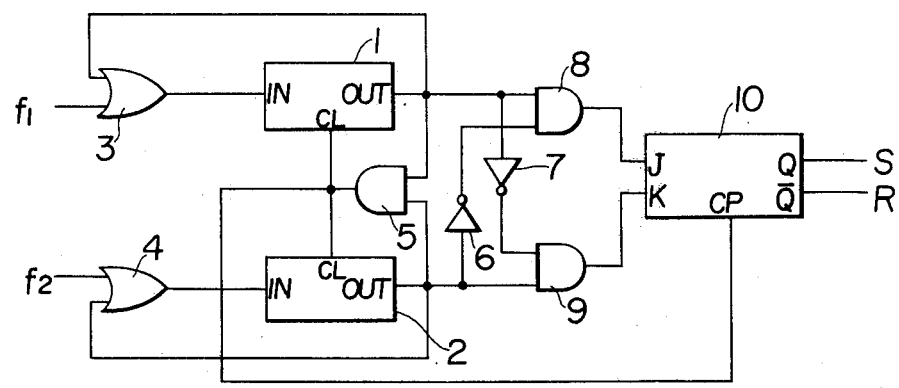
F I G. 5
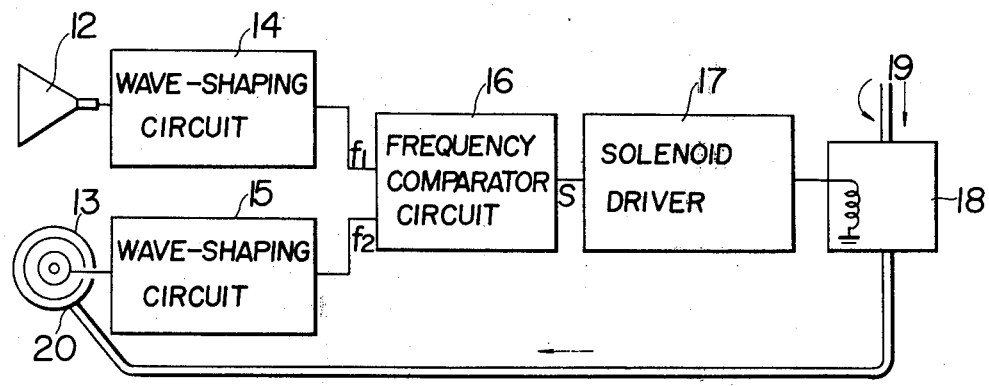

DIGITAL FREQUENCY COMPARATOR CIRCUIT

The present invention relates to a digital frequency comparator circuit, and more particularly such circuit for substantially eliminating an instability thereof.

Known is a digital frequency comparator circuit in which pulse signals with frequencies $f_1$ and $f_2$ are applied to a first and a second counters respectively and these counters, when the pulses are accumulated therein to reach M and N in number respectively, produce signals for driving a circuit to be driven at the subsequent stage, while the output signal earlier issued from the counters is used for clearing both the counters. With the digital type which is usual in this kind of frequency comparator, the circuit to be driven experiences an instability in operation in the vicinity of $f_1/f_2 = $ M/N.

The prior art countermeasure taken to minimize the unstable region is to increase the value of N and M, but it suffers from various problems, for example, an increase of counter capacity, reduction of response rate, incomplete removal of the unstable region, etc.

Accordingly, with a view to completely remove these problems, an object of the present invention is to provide a digital frequency comparator circuit capable of producing a stable output signal.

According to the present invention, there is provided a digital frequency comparator circuit comprising two counters whose outputs are connected with a circuit to be driven, in which the circuit to be driven is actuated by an output signal from one of the two counters and thereafter both the counters are cleared by a later issued output signal from the two counters.

The present invention will become apparent when reading the following description in the accompanying drawings, in which:

FIG. 4 is a schematic circuit of another embodiment of a digital frequency comparator circuit according to the present invention; and FIG. 5 is a block diagram of an anti-skid apparatus for a vehicle using the digital frequency comparator circuit according to the present invention.

Figure 1:
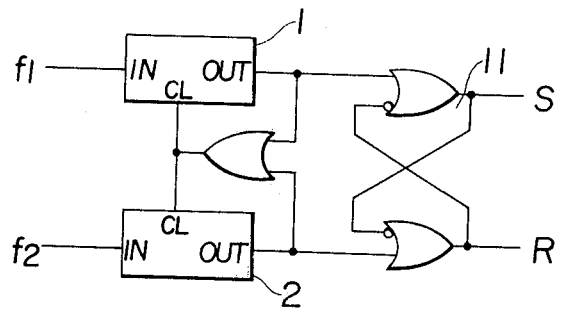
FIG. 1 is a schematic circuit diagram of one example of a digital frequency comparator circuit of prior art.

Referring now to FIG. 1, there is shown an example of a prior art digital frequency comparator circuit. In the figure, designated by the reference numerals 1 and 2 are first and second counters which produce output signals each time the input pulse signals with the frequencies $f_1$ and $f_2$ are accumulated therein to reach M and N. Each of the counters 1 and 2 has a clear terminal CL at which a clear signal is received. A flip-flop, generally designated by 11, comprising two OR gates produces an output signal at a S output terminal when a signal appears at the output of the counter 1 and at a R output terminal when a signal appears at the output of the counter 2. When $f_1/f_2 > $M/N, the first counter 1 earlier produces an output signal so that an output signal is produced at the terminal S of the flip-flop 11, thereby clearing both the counters simultaneously. The result is that no output signal appears at the output of the second counter 2 and thus the flip-flop 11 maintains the output signal at the output S thereof. When $f_1/f_2 < $M/N, the circuit of FIG. 1 operates in a manner converse to that just described. Thus, the circuit of FIG. 1 has a function as a digital frequency comparator.

This circuit, however, experiences instability at the flip-flop 11 thereof in vicinity of $f_1/f_2 = $M/N, because of the digital type thereof. An analysis of this unstable phenomenon will be given below.

Assume that a certain signal cleared the first and the second counters 1 and 2 and then the first counter 1 produces an output signal. With an indiscrimination incidental to the digital count, the following relation holds:

$$(M-1)/f_1 < t_1 < M/f_1$$

Here $t_1$ is the lapse of time from clearing of both the counters to the production of the output signal from the first counter 1. Similarly, the second counter takes the following relation:

$$(N-1)/f_2 < t_2 < N/F_2$$

With these equations in mind, calculation will be performed below of the probability P(s) of occurrence of output signal at the output terminal S of the flip-flop 11.

i. After both the counters are cleared by the signal from the first counter 1, the lapse of time $t_1$ is $t_1 = M/f_1$.
If $t_1$   (N−1)/$f_2$, i.e. $f_1/f_2$   M/(N−1), P(s) = 1.
If $t_1$   N/$f_2$, i.e. $f_1/f_2$   N/N, P(s) = 0.
If (N−1)/$f_2 < t_1 < $N/$f_2$, i.e. M/N$<f_1/f_2<$M/(N−1), $$P(s) = \frac{N/f_2 - t_1}{1/f_2} = N - \frac{M}{f_1/f_2}.$$

ii. After the output signal from the second counter 2 cleared both the counters 1 and 2, the time lapse of $t_2$ is $t_2 = $N/$f_2$.
If $t_2$   (M−1)/$f_1$, i.e. $f_1/f_2$   (M−1)/N, P(s) = 0.
If $t_2$   M/$f_1$, i.e. $f_1/f_2$   N/N, P(s) = 1.
If (M−1)/$f_1<t_2<$M/$f_1$, i.e. (M−1)/N$<f_1/f_2<$M/n, $$P(s) = \frac{t_2 - (M-1)/f_1}{1/f_1} = Nf_1/f_2 - (M-1).$$

Figure 2:
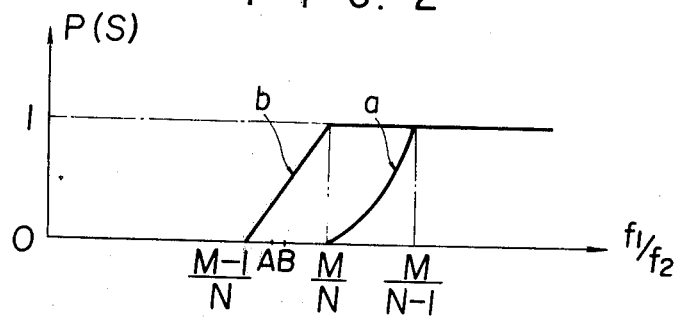
FIG. 2 is a graph illustrating the relation of the probability of occurrence of the output signal at the S output of the circuit of FIG. 1 with respect to the ratio of the frequencies of two input signals.

These relations of (i) and (ii) are graphically illustrated in FIG. 2. Curves a and b represent the probabilities in the case (i) and (ii) respectively. As seen from the figure, the traced curve corresponds to the inversed one of hysteresis.

More specifically, when the ratio $f_1/f_2$ increases, there is a possibility of occurrence of the signal S at an incremental point B of $f_1/f_2$ after the signal R appears at the point A [(M−1)/N$<f_1/f_2<$M/N]. However, since the probability of recurrence of the signal S after the signal S occurs at the point B is zero, the signal to subsequently occur is the signal R. When the ratio $f_1/f_2$ exceeds the ratio M/N, the probability of occurrence of the signal S after the occurrence of the signal R is 1 with a possibility of recurrence of the signal R after the signal S. That is, the flip-flop 11 remains unstable until the ratio $f_1/f_2$ increases beyond the M/(N−1).

This phenomenon is also found in the case of decreasing the ration $f_1/f_2$.

It is revealed from the analysis just made that the flip-flop in the conventional digital frequency comparator is inherently unstable within the range of $f_1/f_2$ of $(M-1)/N < f_1/f_2 < M/(N-1)$.

As indicated above, the unstable operation of the prior art digital frequency comparator may be described in terms of the probability of occurrences of the signal appearing at the output of the flip-flop. However, this has not been noticed heretofore and it has been considered that such instability is just an inevitable problem of indiscrimination inherently incidental to digital counting.

Figure 3:
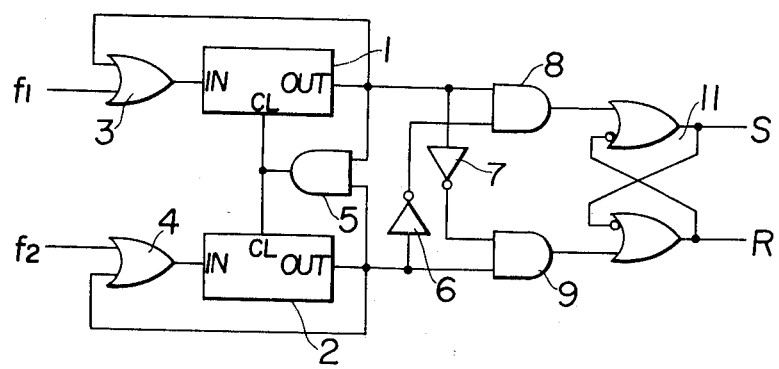
FIG. 3 is a schematic circuit of an embodiment of a digital frequency comparator circuit according to the present invention.

Reference is now made to FIG. 3 illustrating an embodiment of the digital frequency comparator circuit according to the present invention.

In FIG. 3, assume now that the first counter 1 produces first an output signal. The input signal with frequency $f_1$ and the output signal from the first counter 1 are applied to an OR gate 3. The input signal with frequency $f_1$ is a digital signal in which a periodic variation occurs between high and low levels. The first counter 1 produces an output signal of high level when it counts the input signal with frequency $f_1$ to M in number. The OR gate 3 produces, irrespective of the input signal with frequency $f_1$, an output signal of high level in response to the output signal from the first counter 1. Therefore, the counting by the first counter 1 is stopped so that both the input and output signals of the first counter 1 are held in high level. As a result, the OR gate 3 prevents the input signal with frequency $f_1$ from being transferred to the first counter 1. Thus, the output signal from the first counter 1 is held. On the other hand, the output of an inverter 7 is erased. An AND gate 8 is enabled by the output signal from the first counter 1 and the output signal from the inverter 6. The flip-flop 11, in response to the signal from the AND gate 8, produces an output signal. Those are all the changes in operation of the circuit which occur at this stage. The second counter 2 then produces an output signal when it counts the input signals to N in number. At this time, the output signal of the inverter 6 is erased. Accordingly, the AND gate 8 is disabled but the flip-flop 11 is not effected. The AND gate 9 still remains disabled because the output of the inverter 7 is erased. On the other hand, at this time, the AND gate 5 is enabled to transmit a clear signal thereby to clear both the counters 1 and 2. The cleared state of both the counters enables the OR gates 3 and 4 to permit the passing of the input signals therethrough to both the counters 1 and 2. This means that the circuit has returned to its starting state in operation.

When comparing the operation of the circuit according to the present invention with that of the circuit of FIG. 1, a difference therebetween resides in the time at which both the counters are cleared. As a result, inversion is made with respect to the characteristic curves as shown in FIG. 2. That is, the plotted curves without any superposition show a complete hysteresis property. Thus, the instability of the conventional digital frequency comparator circuit is completely eliminated.

As described above, in the digital frequency comparator circuit, the flip-flop as a circuit to be driven is actuated by the output signal produced from one counter which operates to issue a signal earlier than the other counter. However, the effects can be secured if the flip-flop is actuated in a manner converse to that of the first embodiment. The digital frequency comparator circuit shown in FIG 4. is the one embodying such a manner. In this instance, a J-K flip-flop 10 is employed instead of the flip-flop 11 of the FIG. 3 circuit, the J-K flip-flop 10 being connected with the AND gate 5. The operation of the circuit preceding the J-K flip-flop 10 is the same as that of the corresponding portion of the FIG. 3 circuit. The signals produced from both the counters 1 and 2 conditions the AND gate 5 which in turn permits the transmission of the signal to the clear terminals of both the counters 1 and 2 and to the clock pulse terminal CP of the J-K flip-flop 10 as well. Upon receipt of the signal from the AND gate 5, the J-K flip-flop 10 permits the input signal thereto to pass therethrough to the output thereof. Thus, the circuit to be driven in the flip-flop is driven in response to the signal from the counter later issuing the signal.

Turning now to FIG. 5, there is shown an anti-skid apparatus for a vehicle incorporating the digital frequency comparator circuit according to the present invention. In the figure, a vehicle speed sensor 12 and a wheel speed sensor 13 are connected to waveshaping circuits 14 and 15, respectively, where the signals from the respective sensors are converted into pulses with frequencies of $f_1$ and $f_2$ respectively, which in turn are coupled with the frequency comparator circuit 16. A solenoid driver 17 is connected at one end with the frequency comparator circuit 16 while at the output with an actuator 18 provided with a master cylinder 19. A brake is designated by reference numeral 20. In operation, when an excessive skid is detected, the frequency comparator circuit produces a signal at the output S which then actuates the solenoid driver 17. Upon actuation of the solenoid driver 17, the actuator 18 starts to operate. For this, the brake 20 for the wheel is released in spite of the application of the braking force thereto by the master cylinder operation. When the rate of slip is sufficiently diminished, the braking force is again applied to the wheel. The rate of slip is defined as follows:

$$S = \frac{V_v - V_w}{V_v} = \frac{K_v f_1 - K_w f_2}{K_v f_1} = 1 - \frac{K_w f_1}{K_v f_1}$$

where
  $S$: rate of slip
  $V_v$: vehicle speed
  $V_w$: wheel speed
  $K_v, K_w$: coefficients Experimentally, $S \doteq 0.2$ may provide the maximum braking force. However, it is difficult to secure a proper control of the braking force since frequent occurrences of ON and OFF signals in the region where the frequency comparator circuit is unstable at the output, adversely affects the operation of the actuator 18. If using the frequency comparator circuit according to the present invention, a proper control of the rate of slip may be realized because of elimination of the unstable region in operation.

As described above, the present invention completely eliminates the instability which is otherwise incidental to the signal resulting from comparing two signals with respectively different frequencies. In the prior art circuit, increase of the capacity of the counters is necessary for alleviating such an instability with various adverse results, such as increase of cost, sluggish response in the circuit operation, etc. However, according to the present invention, the counter capacity may be flexibly selected without trouble of such limitations.

What is claimed is:

1. A digital frequency comparator circuit comprising two counters whose outputs are connected with a circuit to be driven, in which the circuit to be driven is actuated by an output signal from one of the two counters which earlier issues the output signal and thereafter both the counters are cleared by an output signal issued from the other counter.

2. A circuit according to claim 1, in which the outputs of the counters are connected with the clear terminals thereof, through an AND gate.

3. A circuit according to claim 2, in which each of the counters receives at the input thereof an input signal from an external source and the output signal from itself through an OR gate, and the counting of the one counter is stopped when the output signal of itself is issued.

4. A digital frequency comparator circuit comprising:
   first and second counters having respective input terminals for receiving different external input signals coupled thereto, respective clear terminals, and respective output terminals with which a circuit to be driven is coupled, each of said first and second counters counting the frequency of the external input signal for producing an output signal at the output terminal upon attaining a predetermined count, said circuit to be driven being actuated in response to one of the output signals from said first and second counters; and
   clearing means connected between the output terminals and the clear terminals of said first and second counters for simultaneously clearing both said first and second counters in response to an output signal from one of said first and second counters which is produced later than the output signal produced from the other of said first and second counters.

5. A digital frequency comparator circuit according to claim 4, wherein said clearing means includes an AND gate circuit whose inputs are connected with the output terminals of said first and second counters and whose output is connected with the clear terminals of said first and second counters.

6. A digital frequency comparator circuit according to claim 5, further comprising first and second OR gates, each of said OR gates having an output connected to a respective input terminal of said first and second counters and having two inputs, one of the inputs being connected with a respective external input signal and the other of the inputs being connected with the output terminal of the respective counter, the counting of the frequency of the external input signal by the other of said first and second counters which earlier produces the output signal being stopped until said first and second counters are simultaneously cleared.

7. A digital frequency comparator circuit according to claim 5, wherein said circuit to be driven is a flip-flop having first and second inputs, and further comprising first and second AND gates and first and second inverters, said first AND gate having an output connected with the first input of said flip-flop and two inputs, one of the inputs of said first AND gate being connected with the output terminal of said first counter and the other of the inputs being connected with an output of said second inverter whose input is connected with the output terminal of said second counter, said second AND gate having an output connected with the second input of said flip-flop and two inputs, one of the inputs of said second AND gate being connected with the output terminal of said second counter and the other of the inputs being connected with an output of said first inverter whose input is connected with the output terminal of said first counter.

8. A digital frequency comparator circuit according to claim 7, wherein said flip-flop has a terminal connected with the output of said AND gate circuit for enabling the transmission of a signal entered into the input of said flip-flop.

9. A digital frequency comparator circuit according to claim 4, wherein said circuit to be driven is a solenoid driver of an anti-skid apparatus for a vehicle including an actuator whose input is connected with an output of said solenoid driver and whose output is connected with a brake, the external input signals to said first and second counters being an output from a vehicle speed sensor and an output from a wheel speed sensor, respectively.

10. A digital frequency comparator circuit according to claim 4, wherein one of said first and second counters produces an output signal earlier than an output signal produced by the other of said first and second counters, said circuit to be driven being actuated in response to said earlier produced output signal.

11. A digital frequency comparator circuit according to claim 4, wherein one of said first and second counters produces an output signal later than an output signal produced by the other of said first and second counters, said circuit to be driven being actuated in response to said later produced output signal.

* * * * *